United States Patent [19]

Therssen

[11] Patent Number: 5,561,425
[45] Date of Patent: Oct. 1, 1996

[54] MULTIPLEXED DELTA-SIGMA ANALOG-TO-DIGITAL CONVERTER

[75] Inventor: Dieter E. M. Therssen, Leuven/Heverlee, Belgium

[73] Assignee: U.S. Philips Corporation, New York, N.Y.

[21] Appl. No.: 167,274

[22] Filed: Dec. 14, 1993

[30] Foreign Application Priority Data

Dec. 16, 1992 [EP] European Pat. Off. .............. 92203944

[51] Int. Cl.⁶ ...................................................... H03M 3/02
[52] U.S. Cl. ............................................ 341/143; 341/141
[58] Field of Search .................................. 341/141, 143; 381/2, 4, 7, 20; 395/2.14, 2.2, 2.35, 2.36

[56] References Cited

U.S. PATENT DOCUMENTS 4,534,054  8/1985  Maisel ......................................... 381/4
4,837,527  6/1989  Sauer .
5,345,236  9/1994  Sramek, Jr. ............................. 341/143

FOREIGN PATENT DOCUMENTS

A295024  4/1990  Japan .

OTHER PUBLICATIONS

J. J. van der Kam, "A digital 'decimating' filter for analog-to-digital conversion of hi-fi audio signals", Philips Technical Review 42, No. 6/7, pp. 230–238, Apr. 1986.

Primary Examiner—Howard L. Williams
Attorney, Agent, or Firm—Laurie E. Gathman

[57] ABSTRACT

An analog-to-digital converter for converting a multitude of analog input signals into a corresponding multitude of digital signals comprises a series arrangement of an analog multiplexer (2), an oversampling sigma-delta modulator (8), a decimator-cum-low-pass filter (10), a digital demultiplexer (12), an interpolator (14) and a digital matrix (16), which are all operated in synchronism.

2 Claims, 2 Drawing Sheets

MULTIPLEXED DELTA-SIGMA ANALOG-TO-DIGITAL CONVERTER

FIELD OF THE INVENTION

The invention relates to an analog-to-digital converter for converting an analog input signal into a digital output signal, which converter comprises:

an oversampling sigma-delta modulator for converting the analog signal into a bivalent signal with an oversampling rate N*Fs which is a multiple N of a sampling rate Fs, N being an integer greater than 1, and a decimator for converting the bivalent signal into a decimated digital signal with the sampling rate Fs.

BACKGROUND OF THE INVENTION

Such an analog-to-digital converter is known inter alia from: J. J. van der Kam "A digital 'decimating' filter for analog-to-digital conversion of hi-fi audio signals", Philips Technical Review 42, No. 6/7, pp. 230–238, Apr. 1986, in particular FIG. 3 thereof. Bivalent or 1-bit sigma-delta modulation is a technique by means of which an analog signal is converted into a 1-bit digital signal by oversampling with the aid of quantization means having a deliberately low resolution and high quantization noise. By means of a 1-bit digital-to-analog converter the digital signal is reconverted into an analog feedback signal, which is subtracted from the analog input signal in a differential stage. The difference of the two signals is filtered in a low-pass loop filter and is applied to a clocked comparator operating as a 1-bit quantizer. The use of a sufficiently high loop gain for baseband frequencies of the analog signal ensures that in the 1-bit digital signal the quantization noise in the baseband is comparatively low at the expense of a comparatively higher quantization noise above the baseband. However, as described comprehensively in the above article, a digital decimating filter enables the noise above the baseband to be suppressed effectively and also enables the oversampled 1-bit signal to be converted into a multi-bit digital signal at the desired lower sampling rate. This analog-digital conversion technique is attractive in particular because only a simple decision circuit (comparator) is required for the actual quantization.

In the case of analog-digital conversion of more than one input signal the need arises to limit the number of analog-to-digital converters. In the analog-to-digital conversion of more than one input signal it is known per se to utilize the analog-to-digital converter in time-sharing, an analog multiplexer being arranged in series with the input and a digital demultiplexer being arranged in series with the output of the analog- to-digital converter. For the actual analog-digital conversion an analog-to-digital converter of any customary type may be used, such as flash, multistep or successive approximation convertors. These converters have in common that they supply the output signals directly with the desired digital word length and at the desired sampling rate. Also in this case the use of a 1-bit sigma-delta modulator would be desirable in view of its simplicity. However, this is not possible because of the time delay in the loop of the sigma-delta modulator. The 1-bit sigma-delta modulator output signal would then be subtracted from an analog input signal which does not correspond thereto, which would result in an inextricable crosstalk between the individual input signals.

U.S. Pat. No. 4,837,527 discloses a series arrangement of an oversampling sigma-delta modulator and a decimating network to which a stereo multiplex signal, formed by multiplexing the L and R audio signals, is applied. The stereo multiplex signal comprises a baseband stereo sum signal (L+R), a 19 kHz stereo pilot tone, and an amplitude modulated stereo difference signal (L–R) on an 38 kHz suppressed carrier wave. The decimating network then supplies the digital representation of the stereo multiplex signal, which must subsequently be demodulated digitally to form the digital L and R signals. However, this demodulation is problematic because the suppressed carrier wave must be regenerated.

Japan Patents Abstracts JP-A-2-95024 shows an analog-to-digital converter comprising a sigma-delta modulator and a multiplexer for the application of more than one input signal. A certain transition time is required before the sigma-delta modulator signal is a correct representation of the input signal. This transition time depends on the sampling rate of the sigma-delta modulator. After switching over to another input signal it is again necessary to wait for the expiry of a transition time. In this known analog-to-digital converter this transition time is minimized by initializing the sigma-delta modulator upon each change-over to another input signal. This procedure makes the system comparatively slow.

SUMMARY OF THE INVENTION

It is an object of the invention to provide an analog-to-digital converter comprising an oversampling 1-bit sigma-delta modulator which is capable of processing more than one analog input signal and which does not have the afore-mentioned disadvantages. To this end, according to the invention, the analog-to-digital converter of the type defined in the opening paragraph is characterized in that the analog-to-digital converter further comprises:

an analog multiplexer having K inputs for receiving K analog signals and for supplying to the sigma-delta modulator a time-multiplex signal which within a period 1/Fs of the sampling rate Fs comprises successive portions of the K analog signals, K representing an integer greater than 1, a digital demultiplexer for receiving the decimated digital output signal and for supplying K time-shifted digital signals with the sampling rate Fs, a digital interpolator for converting the K digital signals with the sampling rate Fs, which have been shifted in time relative to one another, into K concurrent interpolated digital signals with the sampling rate Fs, and a digital matrix for converting the K interpolated digital signals into K digital output signals with the sampling rate Fs, each of the K output signals being derived from at least one of the K interpolated signals.

Owing to the analog multiplexer and digital demultiplexer operating in synchronism with the sigma-delta modulator and with the decimator a predictable crosstalk is obtained between the demultiplexed digital time-sequential signals with the sampling rate Fs, which crosstalk is removed by the digital matrix. The digital interpolator ensures a simultaneous input of digital signal samples to the digital matrix.

A further embodiment of an analog-to-digital converter in accordance with the invention is characterized in that the decimator comprises a time-discrete finite-impulse-response half-band low-pass filter having a substantially constant envelope delay and an amplitude characteristic having a roll-off with a 3-dB point situated at the sampling rate Fs, said roll-off being substantially centrically symmetrical relative to sampling rate Fs.

Such a half-band low-pass filter has the following advantages: the rising spectrum of the quantization noise of the sigma-delta modulator is additionally attenuated and a simple matrixing with predictable coefficients remains possible.

BRIEF DESCRIPTION OF THE DRAWINGS

These and other aspects of the invention will now be described and elucidated with reference to the accompanying drawings, in which.

DETAILED DESCRIPTION OF THE PREFERRED EMBODIMENTS

Figure 1:
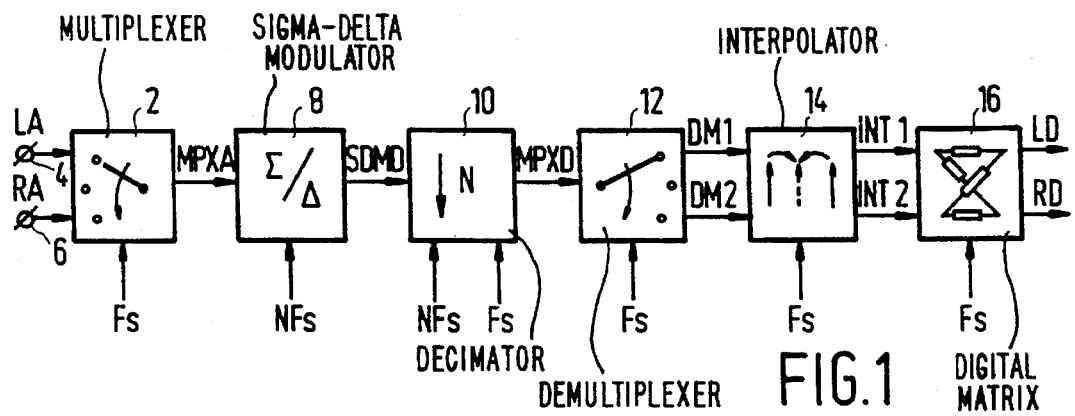
FIG. 1 is a basic circuit diagram of an analog-to-digital converter in accordance with the invention.
Figure 2:
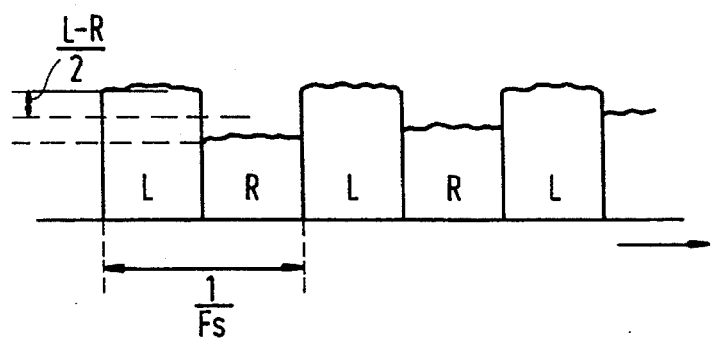
FIGS. 2, 3, 4, 5, 6 and 7 are diagrams to illustrate the operation of an analog-to-digital converter in accordance with the invention.

FIG. 1 shows an analog-to-digital converter in accordance with the invention, which by way of example digitizes two analog signals LA and RA in order to form two digital signals LD and RD. However, the system can be adapted to handle more than two signals. The analog-to-digital converter comprises the series arrangement of an analog multiplexer 2 having inputs 4 and 6 for receiving the analog input signals LA and RA, a 1-bit sigma-delta modulator 8, a decimator 10, a digital demultiplexer 12, a digital interpolator 14 and a digital matrix 16. The operation of all the components is controlled by clock pulses from a clock pulse generator, not shown. The clock pulses are shown in highly simplified form. The frequency of the clock pulses is equal to Fs or a multiple thereof. The multiplexer 2 switches from the input 4 to the input 6 at the sampling rate Fs. As is shown in FIG. 2 this yields an analog multiplex signal MPXA which is the sum of two analog series of samples having a repetition rate Fs and shifted 180 degrees relative to one another. The multiplex signal MPXA comprises a low-frequency component (L+R)/2 and a carrier wave component SQWV*(L−R)/2, where L and R are the instantaneous amplitudes of the analog signals LA and RA and SQWV represents a squarewave function which is alternately positive and negative within the period 1/Fs and which may be expressed as follows:

$$MPXA = \frac{L+R}{2} + \frac{L-R}{2} \times SQWV \quad (1)$$

Figure 3:
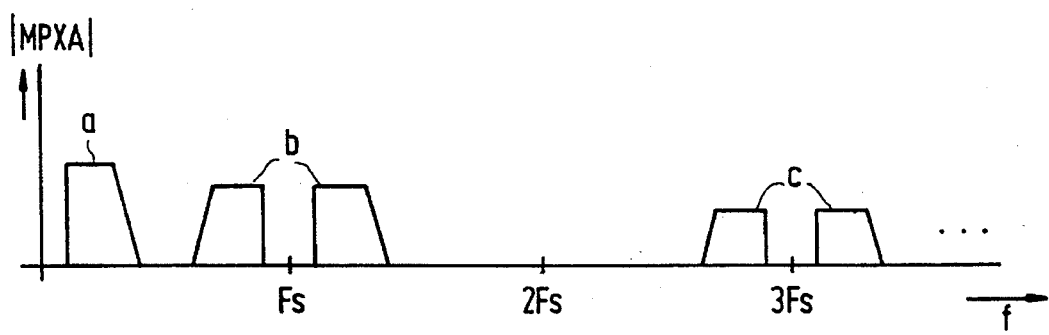

The frequency spectrum of the multiplex signal MPXA is shown in FIG. 3 and comprises the baseband a and harmonics at odd multiples of the sampling rate Fs, of which only the first harmonic b at Fs and the third harmonic c at 3*Fs are shown.

Figure 4:
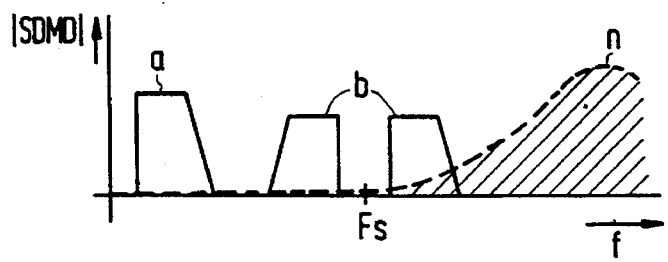

The multiplex signal MPXA is applied to the sigma-delta modulator 8 which operates at an oversampling rate N*Fs and which converts the analog multiplex signal MPXA into a bivalent or 1-bit digital signal SDMD. The effect of an oversampling 1-bit sigma-delta modulator is inter alia that the comparatively very large quantization noise is shifted ("noise shaping") to a range above the useful frequency band of the modulated signal, in the present case the multiplex signal MPXA. This is illustrated in FIG. 4, in which the amplitude of the bivalent signal SDMD has been plotted versus the frequency and in which a and b have the same meaning as in FIG. 3. The spectrum of the noise component n as a result of the coarse quantization in the sigma-delta modulator has been shifted to a frequency range which is complementary to the pass band of the low-pass filter in the loop of the sigma-delta modulator. The bivalent signal SDMD may be written as:

$$SDMD = \frac{L+R}{1} + \frac{L-R}{2} \times \frac{4\alpha}{\pi} \times \sin(2\pi Fs \cdot t + \phi) + HF + n \quad (2)$$

$$\text{where } \alpha = \frac{\frac{\pi}{N}}{\sin\frac{\pi}{N}},$$

HF are the higher harmonics of the signal MPXA, and n is the noise of the sigma-delta modulator.

Figure 5:
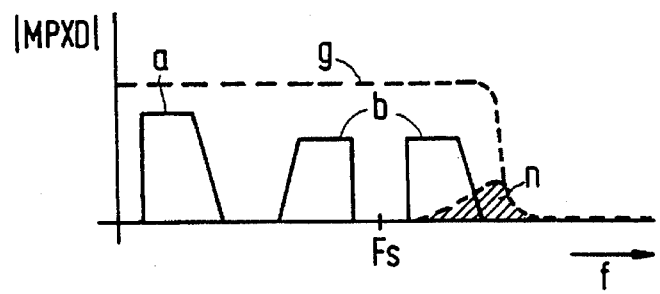
Figure 6:
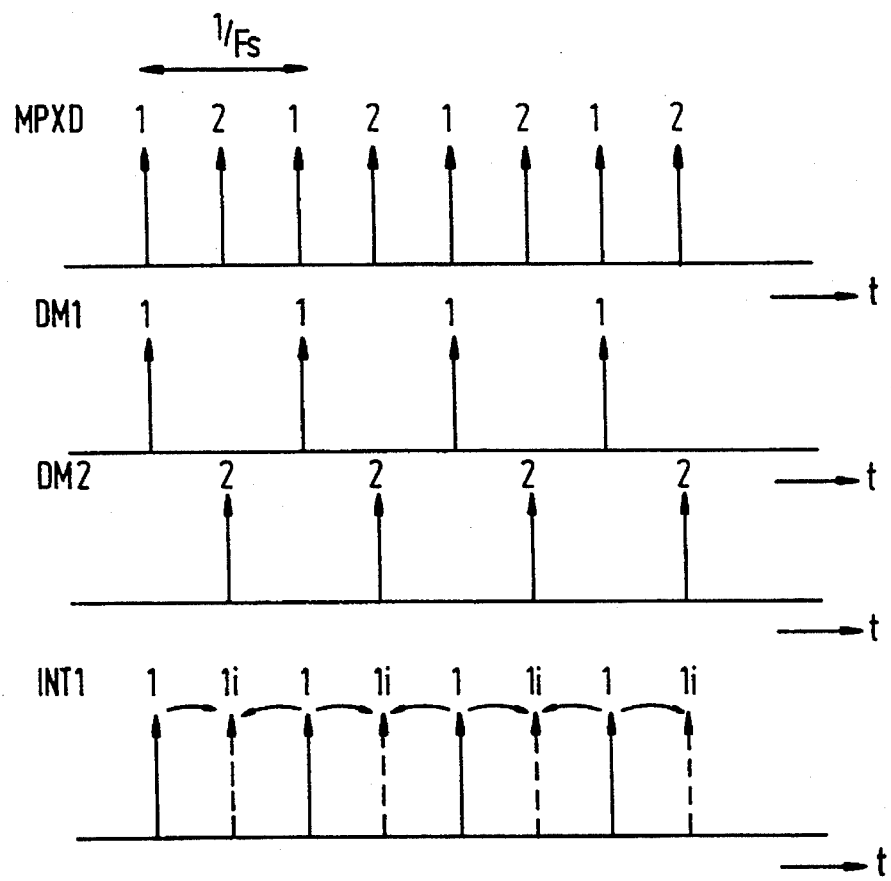

The decimator 10 functions as a digital low-pass filter and also converts the bivalent signal SDMD having the sampling rate N*Fs into a multi-bit digital multiplex signal. MPXD having a lower sampling rate Fs. The theory and operation of 1-bit sigma-delta modulators and decimators are described comprehensively inter alia in article cited above. FIG. 5 shows the frequency spectrum of the digital multiplex signal MPXD, which has been subjected to steep filtering in accordance with the curve g of the decimator, so that the higher harmonics HF are suppressed completely and the noise component n is suppressed almost completely. The digital multiplex signal MFXI is shown in FIG. 6 and comprises a series of samples made up of a first subseries of samples bearing the numeral 1 and a second subseries of samples bearing the numeral 2, the samples of the two subseries alternating with one another. In each period 1/Fs one sample 1 of the first subseries and one sample 2 of the second subseries occur. Allowance being made for the phase shift of the decimator, the series of samples in the digital multiplex signal MPXD may be represented as:

$$MPXD = \frac{L+R}{2} + \frac{2\alpha(L-R)}{\pi} \times [+1, -1, +1, -1, \dots] \quad (3)$$

The demultiplexer separates the two subseries to form the digital signals DM1 and DM2, which are also shown in FIG. 6. The instantaneous value of the samples 1 in the signal DM1 is:

$$DM1 = \frac{\left(\frac{\pi}{2\alpha} + 2\right)L + \left(\frac{\pi}{2\alpha} - 2\right)R}{2\pi} \quad (4)$$

The instantaneous value of the samples 2 in the signal DM2 is:

$$DM2 = \frac{\left(\frac{\pi}{2\alpha} - 2\right)L + \left(\frac{\pi}{2\alpha} + 2\right)R}{2\pi} \quad (5)$$

The signals DM1 and DM2 each comprise a mixture of the signal values L and R of the analog input signals LA and RA. Therefore, it is possible to reconstruct the values L and R by means of a matrix circuit. For this purpose it is first necessary to calculate the signal values of at least one of the subseries DM1 and DM2, for example those of the subseries DM1, for the instants at which the samples in the other subseries DM2 occur, so that the samples of both subseries seemingly originate from the same instants.

This calculation of the intermediate samples is effected in the digital interpolator 14 which derives from the subseries DM1 a new subseries INT1, as is shown in FIG. 6, and which also supplies a signal INT2 in response to the signal DM2. The signal INT2 may be identical to the signal DM2 or to an interpolated version thereof. In the latter case the signals INT1 and INT2 are both interpolated versions of DM1 and DM2, respectively, each with a delay equal to half the time between the samples in the digital multiplex signal MPXD.

In the digital matrix 16 the now concurrent samples of the interpolated signals INT1 and INT2 are converted to the digital output signals LD of an amplitude L and amplitude R. The matrix coefficients follow from equations (4) and (5):

$$LD = INT1 \left[ \frac{2\alpha}{4\pi} + \frac{1}{8} \right] + INT2 \left[ \frac{2\alpha}{4\pi} - \frac{1}{8} \right] \quad (6)$$

$$RD = INT1 \left[ \frac{2\alpha}{4\pi} - \frac{1}{8} \right] + INT2 \left[ \frac{2\alpha}{4\pi} + \frac{1}{8} \right] \quad (7)$$

Interpolators are known per se from, for example, the article: P. A. Regalia et al., "The digital allpass filter: a first versatile signal processing building block", Proceedings of the IEEE, Vol. 76, No. 1, Jan. 1988, pp. 19–32. Analog multiplexers, digital demultiplexers and digital matrices are devices which are known per se in analog and digital signal processing and require no further explanation.

From the above it will be apparent that the system can also be adapted to more than two signals. The multiplexer 2 then cyclically applies the input signals to the sigma-delta modulator 8, the period of the cycle being 1/Fs. If there are K input signals each of the K signals will be transmitted in a fraction 1/(K*Fs). The analog multiplex signal MPXA then is the sum of K sampled analog signals having a phase shift of 360/K degrees relative to one another. The corresponding formulas (1)...(3) are obtained by Fourier series expansion of the signal MPXA. The required coefficients for the corresponding matrix are computed by appropriate adaptation of the above formulas.

Figure 7:
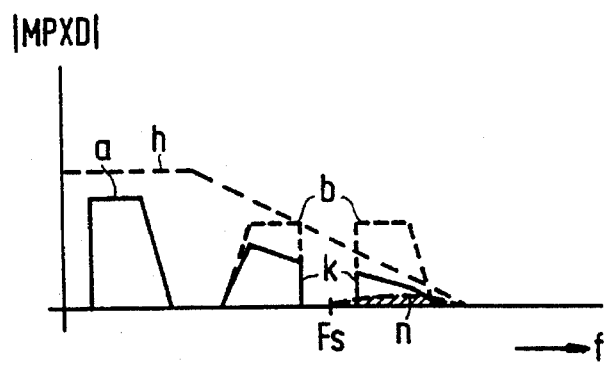

Advantageously, the last filter of the decimator 10 may comprise a time-discrete half-band low-pass filter having a finite impulse response and a substantially constant envelope delay, whose amplitude characteristic h is shown in FIG. 7. The characteristic h is substantially flat for the baseband a and has a roll-off which is centrically symmetrical relative to the sampling rate Fs and has a 3-dB point situated at the sampling rate Fs. The roll-off may cover the entire spectrum of the entire first harmonic b, as is shown in FIG. 7, but it may also cover only a part of the spectrum b. As a result of the roll-off the sum of the frequency components k, which are centrically symmetrical relative to the sampling rate Fs, is substantially constant and is equal to half the sum of the frequency components b. The frequency-dependent attenuation of the digital multiplex signal MPXD caused by the half-band low-pass filter gives rise to an additional attenuation of the first harmonic b by a factor of 2. Allowance can be made for this by replacing the factor 2α in the above equations (3) to (7) by α. Such a half-band low-pass filter has the following advantages: the rising spectrum of the noise component n is attenuated additionally and a simple matrixing with predictable coefficients remains possible. The half-band filter may be formed, for example, by an 11-tap symmetrical fifth-order FIR (finite impulse response) filter, which is known per se as a Quadrature Mirror Filter (QMF), for example, from the article "A trick for the design of FIR half band filters" by P. P. Vaidyanathan et al., IEEE Transactions on Circuits and Systems, Vol. CAS 34, No. 3, Mar. 1987, pp. 297–300.

I claim:

1. An analog-to-digital oconverter for converting an analog input signal into a digital output signal, which converter comprises:

an oversampling sigma-delta modulator for converting the analog signal into a bivalent signal with an oversampling rate N*Fs which is a multiple N of a sampling rate Fs, N being an integer greater than 1, a decinator for converting the bivalent signal into a decimated digital signal with the sampling rate Fs, an analog multiplexer having K inputs for receiving K analog signals and for supplying to the sigma-delta modulator a time-multiplex signal which with in a period 1\Fs of the sampling rate Fs comprises successive portions of the K analog signals, K representing an integer greater than 1, a digital demultiplexer for receiving the decimated digital output signal and for supplying K time-shifted digital signals with the sampling rate Fs, a digital interpolator for converting the K digital signals with the sampling rate Fs, which have been shifted in time relative to one another, into K concurrent digital signals with the sampling rate Fs, and a digital matrix for converting the K concurrent digital signals into K digital output signals with the sampling rate Fs, each of the K output signals being derived from at least one of the K concurrent signals.

2. An analog-to-digital converter as claimed in claim 1, characterized in that the decimator comprises a time-discrete finite-impulse-response half-band low-pass filter, having a substantially constant envelope delay and an amplitude characteristic having a roll-off with a 3-db point situated at the sampling rate Fs.

* * * * *

UNITED STATES PATENT AND TRADEMARK OFFICE
CERTIFICATE OF CORRECTION

PATENT NO. : 5,561,425
DATED : OCTOBER 1, 1996
INVENTOR(S) : DIETER E.M. THERSSEN

It is certified that error appears in the above-indentified patent and that said Letters Patent is hereby corrected as shown below:

claim 1, line 1, change "oconverter" to --converter--.
Claim 1, line 8, change "decinator" to --decimator--.
Claim 1, line 12, change "with in" to --within--.
Claim 2, line 5, change "db" to --dB--.

Signed and Sealed this

Twenty-fourth Day of June, 1997

Attest:

BRUCE LEHMAN

Attesting Officer

Commissioner of Patents and Trademarks